United States Patent
Zheng et al.

[11] Patent Number: 5,930,677
[45] Date of Patent: Jul. 27, 1999

[54] METHOD FOR REDUCING MICROLOADING IN AN ETCHBACK OF SPIN-ON-GLASS OR POLYMER

[75] Inventors: Jia Zhen Zheng; Guo Li Qi Mike; Yi Xu, all of Singapore, Singapore

[73] Assignee: Chartered Semiconductor Manufacturing, Ltd, Singapore, Singapore

[21] Appl. No.: 08/845,252

[22] Filed: Apr. 21, 1997

[51] Int. Cl.[6] .................................................. H01L 21/316
[52] U.S. Cl. .......................... 438/782; 438/624; 438/631; 438/697; 438/699; 438/782
[58] Field of Search ................................... 438/624, 631, 438/697, 699, 782

[56] References Cited

U.S. PATENT DOCUMENTS

| | | | |
|---|---|---|---|
| 4,349,609 | 9/1982 | Takeda et al. | 438/623 |
| 5,270,267 | 12/1993 | Ouellet | 438/710 |
| 5,366,850 | 11/1994 | Chen et al. | 438/631 |
| 5,366,910 | 11/1994 | Ha et al. | 437/40 |
| 5,399,533 | 3/1995 | Pramanik et al. | 437/228 |
| 5,413,963 | 5/1995 | Yen et al. | 437/195 |
| 5,607,880 | 3/1997 | Suzuki et al. | 438/624 |
| 5,639,345 | 6/1997 | Huang et al. | 438/624 |
| 5,654,216 | 8/1997 | Adrian | 438/627 |
| 5,702,980 | 12/1997 | Yu et al. | 438/623 |
| 5,763,954 | 6/1998 | Hyakutake | 438/624 |
| 5,821,163 | 10/1998 | Harvey et al. | 438/631 |

OTHER PUBLICATIONS

Stanley Wolf, Silicon Processing for the VLSI Era, vol. 2, pp. 196–198, 231, 1990.

*Primary Examiner*—Charles Bowers
*Assistant Examiner*—Thanh Nguyen T.
*Attorney, Agent, or Firm*—George O. Saile; Stephen B. Ackerman; Rosemary L. S. Pike

[57] ABSTRACT

A method for forming a planarized interlevel dielectric layer without degradation due to the microloading effect from spin-on material etchback is described. A patterned first conducting layer is provided over an insulating layer on a semiconductor substrate. An improved interlevel dielectric layer is formed overlying the patterned first conducting layer by the following steps. A first oxide layer is deposited overlying the patterned first conducting layer and the insulating layer. A spin-on material layer is coated overlying the first oxide layer and etched back using $O_2$ gas added to the $CHF_3/CF_4$ chemistry until the first oxide layer is exposed overlying the patterned first conducting layer wherein microloading effects from the etching back of the spin-on material layer are lower than microloading effects in a conventional interlevel dielectric layer. A second oxide layer is deposited to complete the interlevel dielectric layer. A second conducting layer is deposited over the interlevel dielectric layer and patterned to complete the fabrication of the integrated circuit device.

29 Claims, 5 Drawing Sheets

METHOD FOR REDUCING MICROLOADING IN AN ETCHBACK OF SPIN-ON-GLASS OR POLYMER

BACKGROUND OF THE INVENTION (1) Field of the Invention

The present invention relates to the fabrication of integrated circuit devices, and more particularly, to a method of improving the planarity and uniformity of interlevel dielectrics in the fabrication of integrated circuits.

(2) Description of the Prior Art

In the fabrication of integrated circuits having multiple conducting levels, planarization of the interlevel dielectric is most important. Typically, the interlevel dielectric is formed by depositing a silicon oxide layer over the surfaces of a conducting layer, coating on a spin-on-glass layer, and etching back the two layers to provide a planarized dielectric surface. FIG. 1 illustrates a partially completed integrated circuit device of the prior art. Semiconductor device structures, such as gate electrodes 14 and source and drain regions 16 have been formed in and on the surface of a semiconductor substrate 10. An insulating layer 18 is formed over the surface of the gate electrodes 14. A metal layer 20 is deposited over the insulating layer and patterned to form metal lines, as shown in FIG. 1. Now the interlevel dielectric layer is to be formed. A silicon oxide layer 22 is deposited conformally over the metal lines. Spin-on-glass layer 24 is coated over the silicon oxide surface.

Referring now to FIG. 2, the spin-on-glass layer 24 is etched back to planarize the layer and to expose the oxide on the tops of the metal lines. However, when the silicon oxide layer 22 is exposed to $CHF_3/CF_4$ plasma during etchback, more oxygen atoms are released from their Si—O bondings. These oxygen atoms consume more $CF_2$ atoms in the adjacent spin-on-glass material, thus enhancing the spin-on-glass etch rate. This is called the microloading effect. More spin-on-glass is consumed than expected. This results in degradation of the planarization, as shown in FIG. 2. The spin-on-glass surface is much lower than the oxide surface. The top layer of the interlevel dielectric sandwich is typically a tetraethoxysilane (TEOS) layer 26. The lack of planarization of the spin-on-glass layer 24 can cause the formation of a keyhole 28 in the TEOS layer for narrow metal spacing.

It is desirable to form a planarized interlevel dielectric layer without microloading effects and without keyhole defects.

U.S. Pat. No. 5,399,533 to Pramanik et al shows a method of eliminating microloading by replacing the oxide layer under the spin-on-glass layer with a nitride layer. U.S. Pat. No. 5,413,963 to Yen et al teaches planarizing the spin-on-glass layer by heating followed by a $N_2$ treatment. U.S. Pat. No. 5,366,910 to Ha et al shows a method of forming a spin-on-glass layer which is treated with $O_2$ plasma, then exposed to the atmosphere to increase the hydrogen content of the layer.

SUMMARY OF THE INVENTION

Accordingly, it is a primary object of the invention to provide a reliable and very manufacturable process for forming an interlevel dielectric layer in the fabrication of an integrated circuit.

It is a further object of the invention to provide a method for forming a planarized interlevel dielectric layer in the fabrication of an integrated circuit.

It is another object to provide a process for forming a planarized interlevel dielectric layer without degradation due to the microloading effect.

Yet another object of the invention is to provide a process for forming a planarized interlevel dielectric layer without degradation due to the microloading effect and without keyhole defects.

In accordance with the objects of the invention, a method for forming a planarized interlevel dielectric layer without degradation due to the microloading effect is achieved. A patterned first conducting layer is provided over an insulating layer on a semiconductor substrate. An improved interlevel dielectric layer is formed overlying the patterned first conducting layer by the following steps. A first oxide layer is deposited overlying the patterned first conducting layer and the insulating layer. A spin-on material layer is coated overlying the first oxide layer and etched back using $O_2$ gas added to the $CHF_3/CF_4$ chemistry until the first oxide layer is exposed and the spin-on material is removed from the top of the patterned first conducting layer wherein microloading effects from the etching back of the spin-on material layer are lower than microloading effects in a conventional spin-on material etchback process using $CHF_3/CF_4$ without added $O_2$. A second oxide layer is deposited to complete the interlevel dielectric layer. A second conducting layer is deposited over the interlevel dielectric layer and patterned to complete the fabrication of the integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
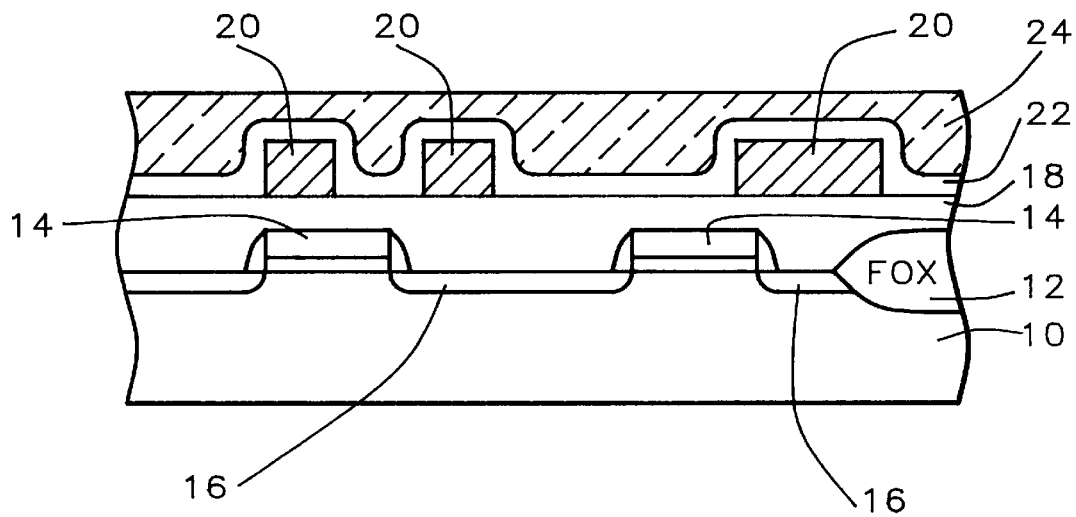
FIGS. 1 and 2 schematically illustrate in cross-sectional representation an interlevel dielectric process of the prior art.
Figure 2:
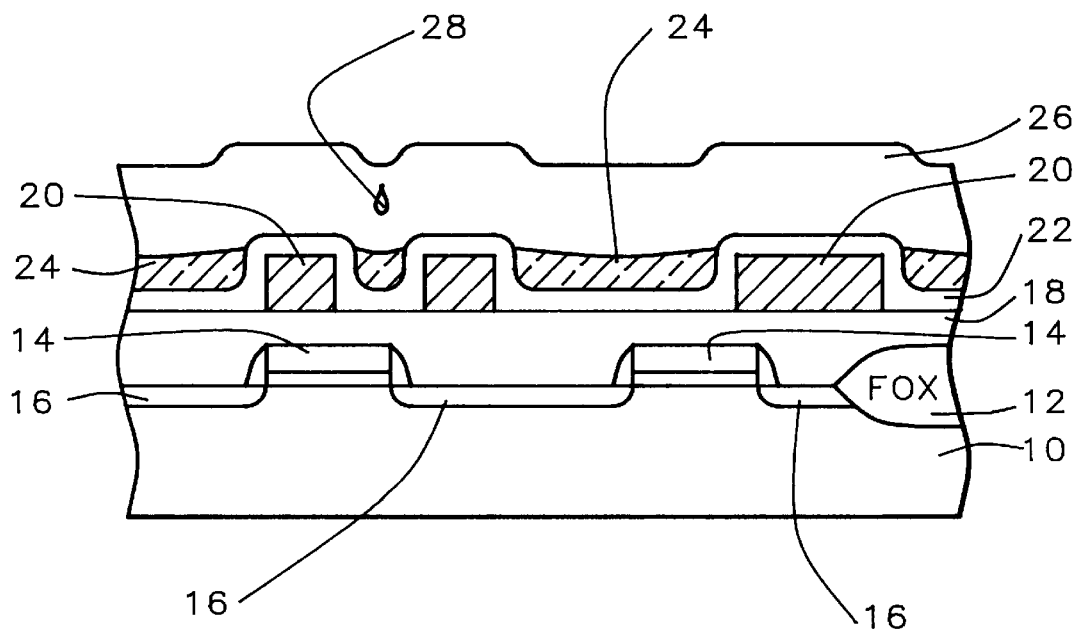

The process of the invention applies to an interlevel dielectric layer over any level conducting layer. This can be a first level conducting layer, such as gate electrodes, or it can be a first level or second level metallization. A first level metallization will be illustrated in the drawings, but it is to be understood that the invention applies to any level conducting layer.

Figure 3:
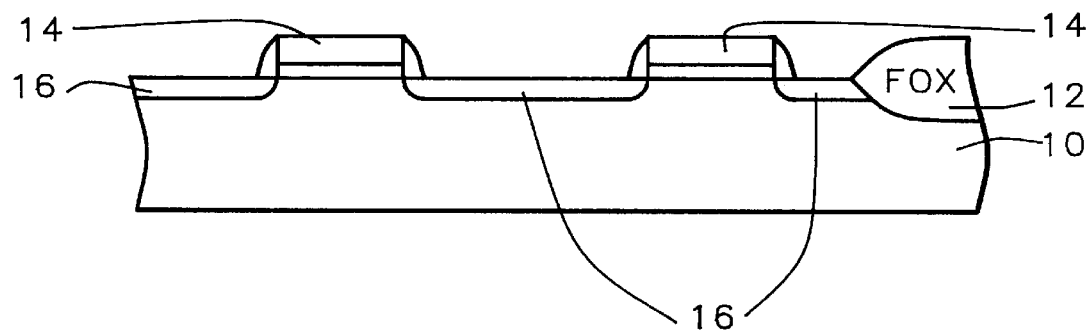
FIGS. 3 through 8 schematically illustrate in cross-sectional representation a preferred embodiment of the present invention.

Referring now more particularly to FIG. 3, there is shown a portion of a partially completed integrated circuit. The semiconductor substrate 10 is preferably composed of monocrystalline silicon. Field oxide regions 12 may be formed to separate active areas. Semiconductor device structures are formed in and on the semiconductor substrate. For example, gate electrodes 14 and source and drain regions 16 are formed as is conventional in the art and as illustrated in FIG. 3.

Figure 4:
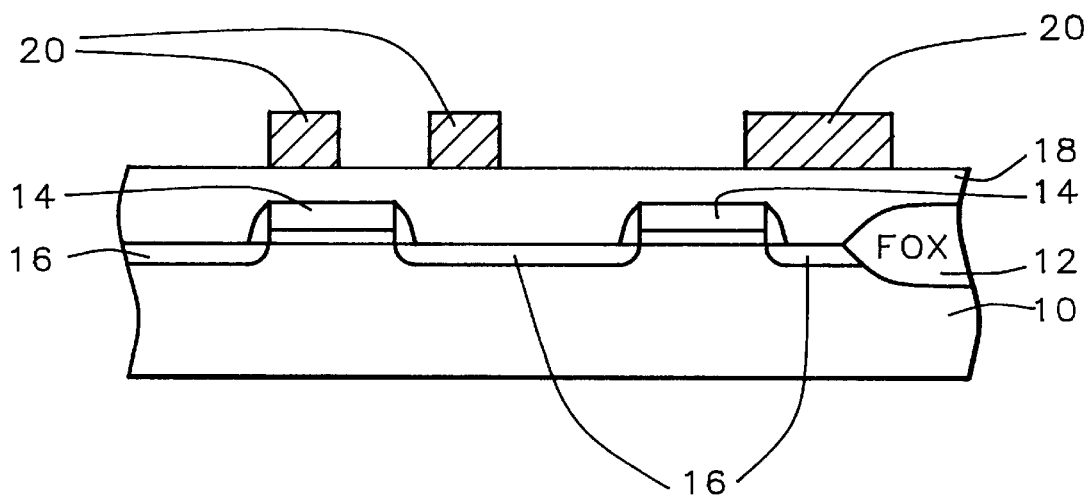

Referring now to FIG. 4, a thick insulating layer 18 is deposited over the semiconductor device structures. This insulating layer may comprise silicon oxide, borophosphosilicate glass (BPSG), phosphosilicate glass (PSG) or the like, or multiple layers of these materials. A metal layer is deposited, typically by sputter deposition, over the surface of the insulating layer 18 and patterned to form metal lines 20, as shown. The top surface of the conducting layer 20 is irregular having peaks and valleys.

Figure 5:
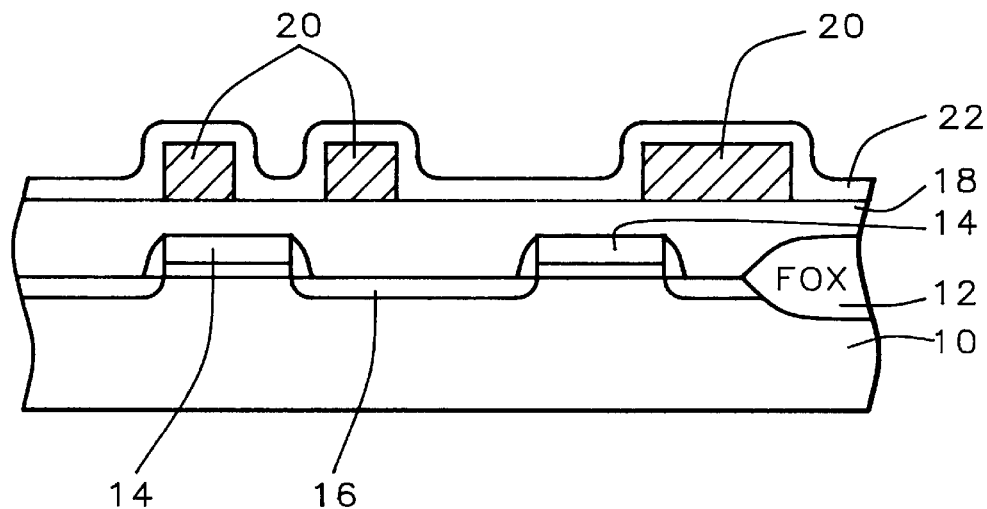

The interlevel dielectric sandwich layer is now to be formed according to the process of the present invention. A conformal layer of silicon oxide 22 is deposited using plasma enhanced chemical vapor deposition (PECVD) to a thickness of between about 500 and 5000 Angstroms, as shown in FIG. 5. The layer 22 alternatively may be PECVD TEOS oxide, silane oxide, or high density plasma oxide.

Figure 6:
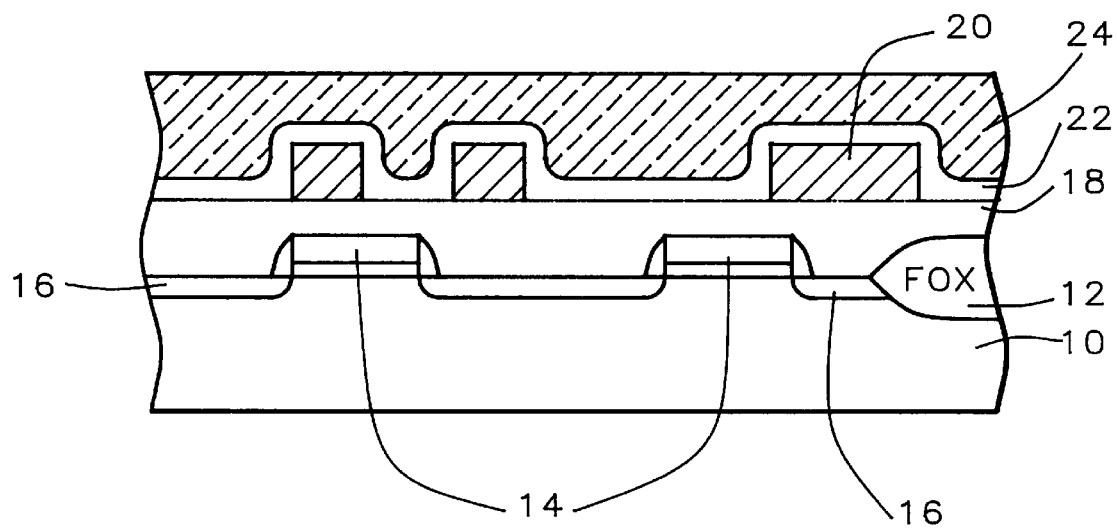

Referring now to FIG. 6, a layer of siloxane or silicate spin-on-glass 24 is coated over the surface of the oxide layer 22 to a thickness of between about 1000 and 8000 Angstroms. Alternatively, the layer 24 may be a coating of a spin-on-polymer, such as methyl silsesquioxane or methyl siloxane. The spin-on-glass or spin-on-polymer is cured, as is conventional in the art.

Figure 7:
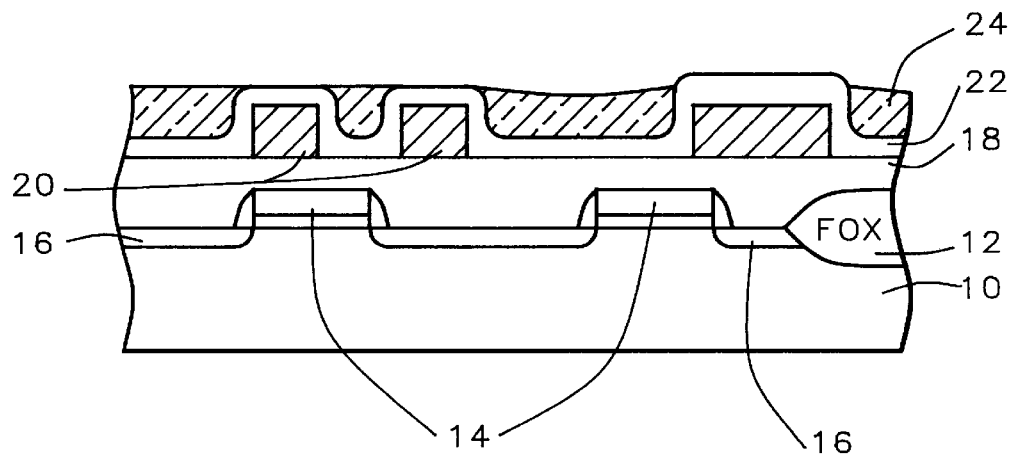

Referring now to FIG. 7, the spin-on-glass or spin-on-polymer layer 24 is etched back until the oxide layer 22 overlying the metal lines 20 is exposed. The etchback of the present invention significantly reduces the microloading effect after etchback resulting in excellent planarization of the interlevel dielectric layer.

The etchback conditions of the present invention comprise $CHF_3/CF_4$ gases in a ratio of 4:40, Argon gas flowed at 100 to 200 sccm, and $O_2$ gas flowed at 2 to 30 sccm at a temperature of 30 to 200° C., pressure of 100 to 400 mTorr, and power of 800 to 1200 watts. The etchback is performed for between about 30 to 90 seconds, depending upon the thickness of the spin-on material layer. The addition of the $O_2$ gas into the $CHF_3/CF_4$ plasma increases the etch rate of the spin-on material layer so that when the first oxide layer 22 is exposed during etchback, the additional release of oxygen will not increase the etchback of the spin-on material. Hence, the microloading effect is eliminated. The addition of $O_2$ gas into the $CHF_3/CF_4$ plasma increases the etch rate of the spin-on material up to as much as 2.4 times the etch rate of the material without the addition of $O_2$.

Figure 8:
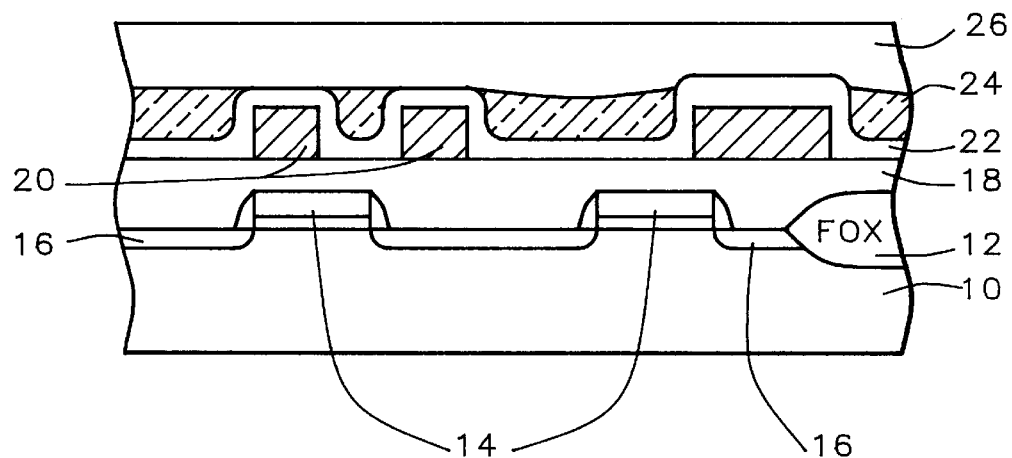

Referring now to FIG. 8, the final layer of the interlevel dielectric sandwich structure is formed. A layer of TEOS oxide or silane oxide 26 is deposited by PECVD over the planarized spin-on-glass or spin-on-polymer and oxide layers to a thickness of between about 3000 and 20,000 Angstroms. Since the layers 24 and 22 are essentially planarized and there is no loss of spin-on-material between the narrow metal lines, no keyhole will be formed.

Optionally, the TEOS layer 26 may be planarized after deposition by chemical mechanical polishing (CMP), for example.

Figure 9:
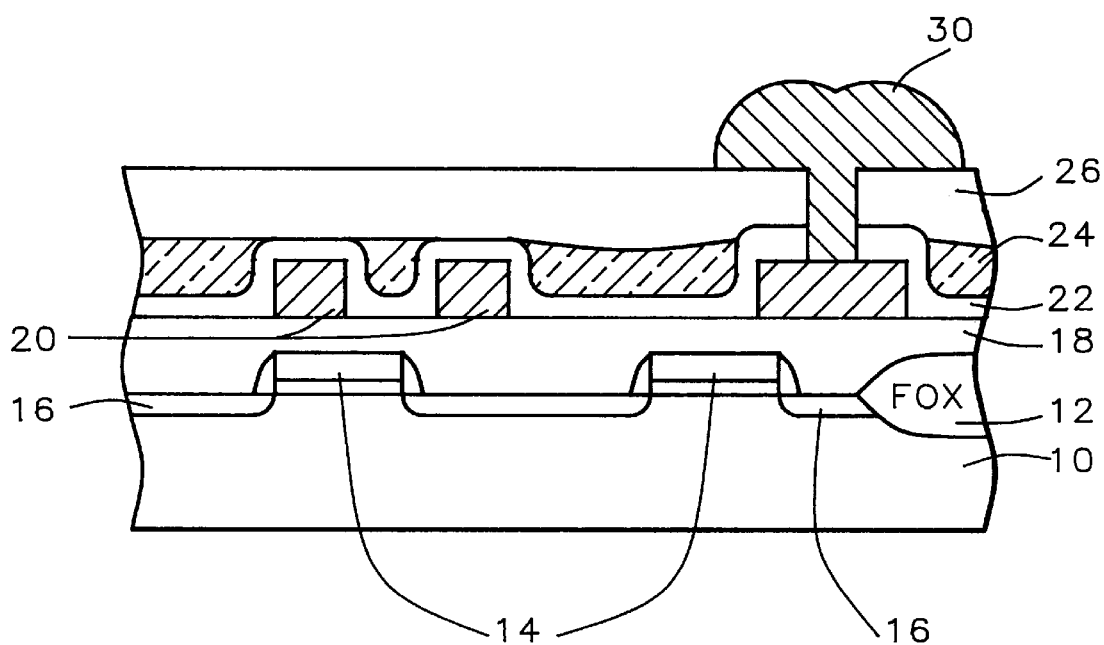
FIG. 9 schematically illustrates in cross-sectional representation a completed integrated circuit device of the present invention.

FIG. 9 illustrates a completed integrated circuit device fabricated according to the process of the present invention. After the interlevel dielectric sandwich layer is completed, contact openings are formed through the interlevel dielectric layer to the underlying metal lines 20. A second conducting layer 30 is deposited and patterned to complete electrical connections. A second interlevel dielectric layer may now be formed according to the process of the invention followed by a third level of metallization, not shown.

The process of the invention results in excellent planarization and uniformity of an interlevel dielectric layer with significantly reduced microloading effect at the spin-on-glass etchback step and elimination of keyhole defects. The addition of $O_2$ to the etchback plasma is much more than the extra release of oxygen when the first oxide layer is exposed; therefore, the microloading effect of the extra release of oxygen is greatly reduced by the process of the invention.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a patterned first conducting layer over an insulating layer on a semiconductor substrate;

forming an interlevel dielectric layer overlying said patterned first conducting layer by the steps of:

depositing a first oxide layer overlying said patterned first conducting layer and said insulating layer;

coating a spin-on material layer overlying said first oxide layer;

etching back said spin-on material layer using a plasma etch to which $O_2$ gas has been added in the amount of 2 to 30 sccm until said first oxide layer is exposed overlying said patterned first conducting layer wherein because of the presence of said $O_2$ gas, the additional release of oxygen from said exposed first oxide layer will not increase the etching rate of said spin-on material whereby microloading effects from said etching back of said spin-on material layer are reduced; and depositing a second oxide layer overlying said spin-on material layer and said exposed first oxide layer;

depositing a second conducting layer over said improved interlevel dielectric layer; and patterning said second conducting layer to complete the fabrication of said integrated circuit device.

2. The method according to claim 1 wherein said semiconductor substrate comprises semiconductor device structures including gate electrodes and source and drain regions in and on a silicon substrate.

3. The method according to claim 1 wherein said first oxide layer comprises silicon oxide having a thickness of between about 500 and 5000 Angstroms.

4. The method according to claim 1 wherein said first oxide layer comprises tetraethoxysilane (TEOS) oxide deposited by plasma enhanced chemical vapor deposition (PECVD) to a thickness of between about 500 and 5000 Angstroms.

5. The method according to claim 1 wherein said first oxide layer comprises silane oxide deposited by plasma enhanced chemical vapor deposition to a thickness of between about 500 and 5000 Angstroms.

6. The method according to claim 1 wherein said first oxide layer comprises high density plasma oxide having a thickness of between about 500 and 5000 Angstroms.

7. The method according to claim 1 wherein said spin-on material layer comprises spin-on-glass coated to a thickness of between about 1000 and 8000 Angstroms.

8. The method according to claim 1 wherein said spin-on material layer comprises a spin-on-polymer coated to a thickness of between about 1000 and 8000 Angstroms.

9. The method according to claim 8 wherein said spin-on-polymer comprises methyl silsesquioxane.

10. The method according to claim 8 wherein said spin-on-polymer comprises methyl siloxane.

11. The method according to claim 1 wherein said etching back of said spin-on material layer is done using a $CHF_3$ and $CF_4$ plasma etch to which $O_2$ gas has been added in the amount of 2 to 30 sccm at a temperature of 30 to 200° C. for a duration of 30 to 90 seconds.

12. The method according to claim 1 wherein said second oxide layer comprises TEOS oxide and is deposited by PECVD to a thickness of between about 3000 and 20,000 Angstroms.

13. The method according to claim 1 wherein said second oxide layer comprises silane oxide and is deposited by PECVD to a thickness of between about 3000 and 20,000 Angstroms.

14. A method of fabricating an integrated circuit device comprising:
providing a patterned first conducting layer over an insulating layer on a semiconductor substrate;
forming an interlevel dielectric layer overlying said patterned first conducting layer by the steps of:
depositing a first oxide layer overlying said patterned first conducting layer and said insulating layer;
coating a spin-on material layer overlying said first oxide layer;
etching back said spin-on material layer using $CHF_3$ and $CF_4$ plasma with $O_2$ gas until said first oxide layer is exposed overlying said patterned first conducting layer wherein because of the presence of said $O_2$ gas, the additional release of oxygen from said exposed first oxide layer will not increase the etching rate of said spin-on material whereby microloading effects from said etching back of said spin-on material layer are reduced and wherein after said etching back of said spin-on material layer said spin-on-material layer and said exposed first oxide layer form a planarized surface; and
depositing a second oxide layer overlying said planarized surface of said spin-on material layer and said exposed first oxide layer;
depositing a second conducting layer over said interlevel dielectric layer; and
patterning said second conducting layer to complete the fabrication of said integrated circuit device.

15. The method according to claim 14 wherein said semiconductor substrate comprises semiconductor device structures including gate electrodes and source and drain regions in and on a silicon substrate.

16. The method according to claim 14 wherein said semiconductor substrate comprises a level of metallization lower than said first patterned conducting layer.

17. The method according to claim 14 wherein said first oxide layer has a thickness of between about 500 and 5000 Angstroms.

18. The method according to claim 14 wherein said spin-on material layer comprises spin-on-glass coated to a thickness of between about 1000 and 8000 Angstroms.

19. The method according to claim 14 wherein said spin-on material layer comprises a spin-on-polymer coated to a thickness of between about 1000 and 8000 Angstroms.

20. The method according to claim 14 wherein said etching back of said spin-on material layer is done using said $CHF_3$ and $CF_4$ plasma etch to which said $O_2$ gas has been added in the amount of 2 to 30 sccm at a temperature of 30 to 200° C. for a duration of 30 to 90 seconds.

21. The method according to claim 14 wherein said second oxide layer comprises TEOS oxide and is deposited by PECVD to a thickness of between about 3000 and 20,000 Angstroms.

22. The method according to claim 14 wherein said second oxide layer comprises silane oxide and is deposited by PECVD to a thickness of between about 3000 and 20,000 Angstroms.

23. A method of fabricating a planarized and improved interlevel dielectric layer in an integrated circuit device comprising:
providing a patterned first conducting layer over an insulating layer on a semiconductor substrate;
depositing a first oxide layer overlying said patterned first conducting layer and said insulating layer;
coating a spin-on material layer overlying said first oxide layer;
etching back said spin-on material layer using a plasma etch to which $O_2$ gas is added until said first oxide layer is exposed overlying said patterned first conducting layer wherein because of the presence of said $O_2$ gas, the additional release of oxygen from said exposed first oxide layer will not increase the etching rate of said spin-on material whereby microloading effects from said etching back of said spin-on material layer are reduced and wherein after said etching back of said spin-on material layer, said spin-on-material layer and said exposed first oxide layer form a planarized surface; and
depositing a second oxide layer overlying said planarized surface of said spin-on material layer and said exposed first oxide layer to complete the formation of said planarized and improved interlevel dielectric layer in the fabrication of said integrated circuit device.

24. The method according to claim 23 wherein said first oxide layer has a thickness of between about 500 and 5000 Angstroms.

25. The method according to claim 23 wherein said spin-on material layer comprises spin-on-glass coated to a thickness of between about 1000 and 8000 Angstroms.

26. The method according to claim 23 wherein said spin-on material layer comprises a spin-on-polymer coated to a thickness of between about 1000 and 8000 Angstroms.

27. The method according to claim 23 wherein said etching back of said spin-on material layer is done using $CHF_3$ and $CF_4$ plasma in a ratio of 4:40 to which said $O_2$ gas has been added in the amount of 2 to 30 sccm at a temperature of 30 to 200° C. for a duration of 30 to 90 seconds.

28. The method according to claim 23 wherein said second oxide layer comprises TEOS oxide and is deposited by PECVD to a thickness of between about 3000 and 20,000 Angstroms.

29. The method according to claim 23 wherein said second oxide layer comprises silane oxide and is deposited by PECVD to a thickness of between about 3000 and 20,000 Angstroms.

* * * * *

UNITED STATES PATENT AND TRADEMARK OFFICE
CERTIFICATE OF CORRECTION

PATENT NO. : 5,930,677
DATED : 07/27/99
INVENTOR(S) : Jia Zhen Zheng, Mike Li Qi Guo, Yi Xu It is certified that error appears in the above-identified patent and that said Letters Patent is hereby corrected as shown below:

On the Cover Page, at (75), delete "GUO LI QI MIKE", and replace with --LI QI MIKE GUO--.

Signed and Sealed this

Fifth Day of December, 2000

*Attest:*

*Attesting Officer*

Q. TODD DICKINSON

*Director of Patents and Trademarks*